United States Patent [19]

Yahagi et al.

[11] Patent Number: 4,991,447

[45] Date of Patent: Feb. 12, 1991

[54] TORQUE DETECTING DEVICE

[75] Inventors: Shinichiro Yahagi, Ohbu; Hiroyuki Aoki, Yokohama; Takanobu Saito, Okazaki, all of Japan

[73] Assignees: Daido Tokushuko Kabushiki Kaisha; Nissan Motor Company Limited, both of Japan

[21] Appl. No.: 430,406

[22] Filed: Nov. 2, 1989

[30] Foreign Application Priority Data

Nov. 4, 1988 [JP] Japan ................................. 63-278981

[51] Int. Cl.⁵ ............................................. G01L 3/10
[52] U.S. Cl. ............................... 73/862.36; 73/DIG. 2
[58] Field of Search ...................... 73/862.36, DIG. 2

[56] References Cited

U.S. PATENT DOCUMENTS 4,823,617  4/1989  Hase et al. ................. 73/862.36

FOREIGN PATENT DOCUMENTS 181575  10/1984  Japan .

Primary Examiner—Charles A. Ruehl
Attorney, Agent, or Firm—Sughrue, Mion, Zinn, Macpeak & Seas

[57] ABSTRACT

A torque detecting device has a measuring shaft, an excitation device and a detector for detecting a magnetostriction passing through said measuring shaft. The device is able to measure the torque with accuracy even if a temperature gradient is produced in the axial direction of the measuring shaft by making the measuring shaft from a material having specified electromagnetic characteristics at least in a part in which said magnetostrictive force is detected.

14 Claims, 6 Drawing Sheets

TORQUE DETECTING DEVICE

BACKGROUND OF THE INVENTION

1. Field of the Invention

This invention relates to a torque detecting device of the magnetostriction type used for detecting torque applied on a measuring shaft.

2. Description of the Prior Art

For example, there has been such a torque detecting device of the magnetostriction type as shown in FIG. 1 to FIG. 3 (Specification and Drawings of Japanese Patent Application No. 63-50820).

The torque detecting device 1 shown in FIG. 1 to FIG. 3 is provided with a measuring shaft 2 at the center thereof. On the surface of said measuring shaft 2, concave parts 3a, 3b and convex parts 4a, 4b making a certain angle with the axial direction of said measuring shaft 2 are formed to be integral with said measuring shaft 2 at appropriate spaces, and shaped-magnetic anisotropy is given by these concave parts 3a, 3b and convex parts 4a, 4b.

In this case, said concave part 3a, convex part 4a on the one side and concave part 3b, convex part 4b on the other side are provided as a pair with an inclination of 45° relative to the axial direction in opposite directions relative to each other.

The torque detecting device 1 has a pair of coils 5a, 5b disposed in facing relation to the concave part 3a, convex part 4a on the one side and concave part 3b, convex part 4b on the other side which are formed on said measuring shaft 2 as an addition to the said measuring shaft 2, and has the structure providing a cylindrical yoke 7 made from a material with high permeability at the outside of said coils 5a, 5b while leaving a gap 6 between the yoke 7 and the measuring shaft 2. In this case, the coils 5a and 5b are used for excitation means for forming a magnetic circuit wherein the measuring shaft 2 is a part of said magnetic circuit in common with detection means for detecting a magnetostriction passing through said measuring shaft 2.

In the torque detecting device 1 having such a structure, the coils 5a and 5b compose the bridge circuit in combination with resistors 11 and 12 as exemplified in FIG. 2. Said bridge circuit is provided with a variable resistance 13 for balancing and the excitative directions are adjusted into the same direction by connecting an excitative oscillator 14 to connecting points A, C in the bridge circuit. A differential amplifier 15 is connected to connecting points B, B' so as to pick up a detection output from output terminals 16, 17.

The operation of the torque detecting device 1 shown in FIG. 1 connected to the electric circuit shown in FIG. 2 will be described as follows.

In the first place, during operation AC with constant amplitude (V) and frequency (f) is applied to the coils 5a and 5b from the excitative oscillator 14. In consequence of this electric charging, lines of magnetic force forming the magnetic circuit comprised of measuring shaft 2→gap 6→yoke 7→gap 6→measuring shaft 2 are generated surrounding the coils 5a and 5b.

The lines of magnetic force flow in a part of surface of the measuring shaft 2, in particular in the convex parts 4a, 4b mainly, because the concave parts 3a, 3b are formed on the measuring shaft 2 at a certain angle with the axial direction of the said measuring shaft 2, they become magnetic reluctance. Hence the effect of shaped-magnetic anisotropy caused by said concave parts 3a, 3b and convex parts 4a, 4b is produced.

If torque is applied on the measuring shaft 2 in the direction T shown in FIG. 1, the maximum tensile stress $-\sigma$ acts on it because the convex part 4a on the one side is formed in the direction of 45° to the right side on the contrary, the maximum compressive stress $-\sigma$ acts on it because the convex part 4b on the other side is formed in the direction of 45° to the left side.

Therefore, if the measuring shaft 2 has a positive magnetostriction effect, the permeability of the convex part 4a on the one side increases in comparison with it when the torque is zero. On the contrary the permeability of the convex part 4b on the other side decreases in comparison with it when the torque is zero.

Consequently, increasing the inductance $L_1$ of the coil 5a on the one side and, decreasing the inductance $L_2$ of the coil 5b on the other side, the balance of the bridge circuit shown in FIG. 2 breaks and an output corresponding to the torque is generated between the output terminals 16 and 17.

In case the torque is applied on the measuring shaft 2 in the opposite direction, according to an adverse effect, decreasing the inductance $L_1$ of the coil 5a on the one side and, increasing the inductance $L_2$ of the coil 5b on the other side, the balance of the bridge circuit shown in FIG. 2 breaks and the detection output having a characteristic shown in FIG. 3 corresponding to the torque is generated between the output terminals 16 and 17.

In the torque detecting device 1 having such a structure, because the concave parts 3a, 3b and the convex parts 4a, 4b are formed in a pair with reverse inclination facing the coils 5a and 5b respectively, and the difference of magnetism variation at said concave parts 3a, 3b and convex parts 4a, 4b is detected by means of a bridge circuit, the temperature of the measuring shaft 2 changes uniformly on the whole, the zero point of the output can cease to shift and it is possible to heighten the detecting accuracy of the torque even if the permeability of the measuring shaft 2 is varied on the whole according to the temperature.

However, in such the conventional torque detecting device 1 of the magnetostriction type, if a temperature gradient is produced in the axial direction of the measuring shaft 2 owing to heat generated by a motor connected on the one side of the measuring shaft 2 for example, the permeability of the measuring shaft 2 is varied in the axial direction and the inductance $L_1$ and $L_2$ of the coils 5a and 5b change respectively. Accordingly, there is a problem in that the zero point of output may shift owing to the unbalance produced between the connecting points B and B' shown in FIG. 2, and the remarkable drift of the detection output sometimes occurs.

SUMMARY OF THE INVENTION

This invention is made in view of the above-mentioned problem of the prior art and it is an object of the present invention to provide a torque detecting device of the magnetostriction type which is able to prevent the occurrence of the serious drift of the detection output even if a temperature gradient is produced in the axial direction of the measuring shaft.

The construction of the torque detecting device according to this invention for attaining the above-mentioned object is characterized by having a measuring shaft, excitation means for forming a magnetic circuit wherein said measuring shaft is part of said magnetic circuit, and detection means for detecting a magnetostriction passing through said measuring shaft, wherein said measuring shaft has following electromagnetic characteristics at least in a part in which said magnetostriction is detected: electric resistivity $\rho_{RT}$ of not less than 30 $\mu\Omega$—cm at room temperature; temperature coefficient $\alpha\rho$ of electric resistivity of not more than $0.25 \times 10^{-2}/°$C. at temperature of $-50°$ to 150° C.; and temperature coefficient $\alpha_L$ of inductance L of not more than $0.07 \times 10^{-2}/°$C. at temperature of $-50°$ to 150° C.

DETAILED DESCRIPTION OF THE INVENTION

Figure 1:
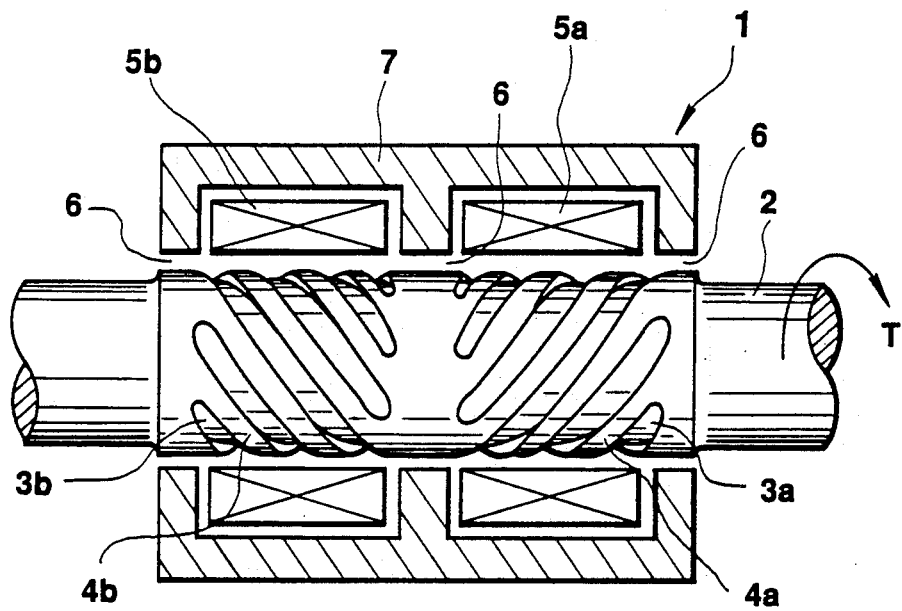
FIG. 1 is a cross-sectional view illustrating the structure of a prior art torque detecting device of the magnetostriction type.

As described above, the torque detecting device according to this invention has the structure provided with a measuring shaft, excitation means for forming a magnetic circuit wherein said measuring shaft is a part of said magnetic circuit, and detection means for detecting a magnetostriction passing through said measuring shaft. While it is applicable to a torque detecting device having the same or similar structure of the torque detecting device 1 exemplified in FIG. 1, it is needless to say that it is not restricted to the torque detecting device 1 having structure shown in FIG. 1. For example, excitation means and detection means may be constructed from different coils, namely, from the excitation coil and the detection coil respectively in place of forming said excitation and detection means from common coils 5a and 5b. When the magnetic anisotropy is given to the measuring shaft 2, it is not restricted to forming concave parts 3a, 3b and convex parts 4a, 4b as shown in FIG. 1, said magnetic anisotropy may be given by sticking the magnetic material on the measuring shaft 2 or by performing surface treatment on the measuring shaft 2.

In the torque detecting device 1 according to this invention, at least a part in which magnetostriction is detected of the measuring shaft 2 has electromagnetic characteristics so that electric resistivity $\rho_{RT}$ at room temperature is not less than 30 $\mu\Omega$—cm, temperature coefficient $\alpha\rho$ of electric resistivity $\rho$ at temperature of $-50°$ to 150° C. is not more than $0.25 \times 10^{-2}/°$C., and temperature coefficient $\alpha_L$ of inductance L at temperature of $-50°$ to 150° C. is not more than $0.07 \times 10^{-2}/°$C. Namely, at least in a part of the measuring shaft 2 which forms a part of the magnetic circuit excited by an alternating magnetic field, the higher electric resistivity of said measuring shaft 2 is desirable at least in the part in which the magnetostriction is detected. That is, because an eddy current is generated at said measuring shaft 2 in the alternating magnetic field, a loss increases, and so an increase of heat generation and lowering of transmissivity are induced when the electric resistivity of the part forming the magnetic circuit of the measuring shaft 2 is low. It has been confirmed that the higher electric resistivity $\rho_{RT}$ at room temperature is, the smaller its temperature change is. Considering from such a viewpoint it has been confirmed that it is desirable to use a material having electric resistivity $\rho_{RT}$ at room temperature not less than 30 $\mu\Omega$—cm for the measuring shaft 2 at least in the part in which the magnetostriction is detected.

And when the temperature coefficient $\alpha\rho$ of electric resistivity $\rho$ of the measuring shaft 2 at least in the part in which the magnetostriction is detected is small, the range of fluctuation becomes narrow. Consequently, it has been confirmed that the thermal characteristic of the torque detecting device 1 is improved. Considering from such a viewpoint, it has been confirmed that it is desirable to use a material having temperature coefficient $\alpha\rho$ of electric resistivity $\rho$ not more than $0.25 \times 10^{-2}/°$C. at temperature of $-50°$ to 150° C., and temperature coefficient $\alpha_L$ of inductance L not more than $0.07 \times 10^{-2}/°$C. at temperature of $-50°$ to 150° C. for the measuring shaft 2 at least in the part in which the magnetostriction is detected.

In this invention, the temperature range of said characteristics is defined in a range of $-50°$ to 150° C. considering the temperature range in which machinery structure such as a motor vehicle is used generally.

In the torque detecting device 1 according to this invention, the measuring shaft 2, in all or at least in the part in which the magnetostriction is detected, may be made from a material comprising, by weight percentage of, not more than 1.5% of C, not more than 4.0% of Si, not more than 3.0% of Mn, and one or both of not more than 5.0% of Ni and not more than 5.0% of Cr, and if necessary not more than 3.0% of Al, not more than 5.0% of Co, and if necessary at least one selected from not more than 0.5% of Pb, not more than 0.5% of Bi, not more than 0.5% of S, not more than 0.3% of P, not more than 0.5% of Te, not more than 0.5% of Se and not more than 0.05% of Ca, and if necessary at least one selected from not more than 1.0% of Cu, not more than 1.0% of Mo, not more than 0.05% of B, not more than 0.5% of W, not more than 0.5% of V, not more than 0.5% of Ti, not more than 0.5% of Nb, not more than 0.5% of Ta, not more than 0.5% of Zr, not more than 0.5% of Hf and not more than 0.1% of N, with the remainder being Fe and impurities, and having electromagnetic characteristics that electric resistivity $\rho_{RT}$ at room temperature is not less than 30 $\mu\Omega$—cm, temperature coefficient $\alpha\rho$ of electric resistivity at temperature of $-50°$ to 150° C. is not more than $0.25 \times 10^{-2}/°$C., and temperature coefficient $\alpha_L$ of inductance L at temperature of $-50°$ to 150° C. is not more than $0.07 \times 10^{-2}/°$C.

In this case, C is a necessary element to maintain the strength required in shaft structural substances of a power transmission system and the like such as a drive shaft or a column shaft. In order to obtain required strength, it is preferable to contain not less than 0.1% of C. However, if the amount is too large, the toughness is rather degraded and plastic workability in cold is adversely affected, so that it is desirable to define the upper limit of C as 1.5%. And in the case of carburizing, it is preferable to contain not more than 0.35% of C so as to contain not more than 1.5% of C in the carburized layer. Si is effective to increase the sensitivity, and to decrease the hysteresis, and so it is desirable to contain not less than 0.5% of Si in case Co is not contained. However, if the amount is too large, the toughness is degraded so that it is preferable to contain not more than 4.0% of Si. Mn acts a deoxidizer and a desulfurizing agent at steel making and an effective element for increasing the strength by improving the hardenability of steel. It is desirable to contain not more than 3.0% of Mn because the workability is degraded if it contains too much Mn. Furthermore, Ni and Cr are effective elements for increasing the strength in consequence of improving the hardenability of the steel and reinforcing the matrix. It is preferable to contain not more than 5.0% of Ni because the hysteresis increases when Ni is contained too much, and preferable to contain not more than 5.0% of Cr because the sensitivity is degraded if it contains too much Cr. Al may be contained according to demand in the range of not less than 3.0% because it is effective to increase the sensitivity and to decrease the hysteresis similarly to the case of Si. Co may be contained in case of need in the range of not more than 5.0% because it is effective to increase the sensitivity similarly to the case of Si or Al. And Pb, Bi, S, P, Te, Se, and Ca are effective to improve the machinability, so that it is preferable to contain at least one of them in the ranges not more than 0.5% of Pb, not more than 0.5% of Bi, not more than 0.5% of S, not more than 0.3% of P, not more than 0.5% of Te, not more than 0.5% of Se, and not more than 0.05% of Ca. Cu and Mo may be contained according to demand in the range of not less than 1.0% respectively, because Cu and Mo are effective elements equally for reinforcing the matrix of steel and improving the strength. In addition to above, B may be contained in the range of not more than 0.05% in order to improve the hardenability of steel, and at least one of not more than 0.5% of W, not more than 0.5% of V, not more than 0.5% of Ti, not more than 0.5% of Nb, not more than 0.5% of Ta, not more than 0.5% of Zr, not more than 0.5% of Hf and not more than 0.1% of N may be contained in order to improve the strength by grain refining and precipitation hardening. Furthermore, in the measuring shaft 2 having such chemical compositions, it is desirable according to demand to perform not only ordinary quenching tempering but also carburizing, carburizing-tempering, carbonitriding, nitriding, induction hardening-tempering, and it is preferable to keep the amount of C in the carburized layer in the range of more than 0.1% to 1.5% according to demand for example.

And, in addition to above, the measuring shaft 2, in all or at least in the part in which the magnetostriction is detected, may be made from a material comprising, by weight percentage of, not more than 0.1% of C, not more than 3.0% of Mn, not more than 10% of Si+Al, in the range of 30 to 90% of Ni, not more than 10% of Cu+Cr+Mo+Ti+W+V+Nb+Ta+Zr, with the remainder being substantially Fe and having electromagnetic characteristics that electric resistivity $\rho_{RT}$ at room temperature is not less than 30 $\mu\Omega$−cm, temperature coefficient $\alpha\rho$ of electric resistivity $\rho$ at temperature of −50° to 150° C. is not more than $0.25 \times 10^{-2}/°C.$, and temperature coefficient $\alpha_L$ of inductance L at temperature of −50° to 150° C. is not more than $0.07 \times 10^{-2}/°C.$ In this case, it is desirable to contain not more than 0.15% of C, because the magnetic characteristics are degraded if contained too much. Mn is effective to improve the workability in cold and hot, however Mn contained too much degrades the machinability so that it is desirable to contain not more than 3.0%. Si and Al are effective elements for improvement of the electric resistivity, reduction of the temperature coefficient of the electric resistivity and reduction of the temperature coefficient of the inductance, but it is desirable to contain not more than 10% of Si+Al because the strength is lowered and the machinability is degraded when they are contained too much. Ni is effective to improve the magnetic characteristics as a main element of Permalloy, it is preferable to contain in the range of 30 to 90%. And it is also preferable to contain in the range of not more than 10% of Cu+Cr+Mo+Ti+W+V+Nb+Ta+Zr, because these elements are effective to improve the magnetic characteristics and the strength.

Furthermore, in addition to above, the measuring shaft 2, in all or at least in the part in which the magnetostriction is detected, may be also made from a material comprising, by weight percentage of, not more than 0.1% of C, not more than 3.0% of Mn, in the range of 4 to 18% of Si+Al, not more than 10% of Co+Cu+Ni+Cr+Mo+W+V+Nb+Ta+Ti+Zr, with the remainder being substantially Fe and having electromagnetic characteristics that electric resistivity $\rho_{RT}$ at room temperature is not less than 30 $\mu\Omega$−cm, temperature coefficient $\alpha\rho$ of electric resistivity $\rho$ at temperature of −50° to 150° C. is not more than $0.25 \times 10^{-2}/°C.$, and temperature coefficient of inductance L at temperature −50° to 150° C. not more than $0.07 \times 10^{-2}/°C.$ In this case, it is desirable to contain not more than 0.1% of C because the magnetic characteristics are degraded if C is contained too much. Mn is effective to improve the workability in cold and hot, however Mn contained too much degrades the machinability, so it is desirable to contain not more than 3.0%. Si and Al are effective elements for improvement of the electric resistivity reduction of the temperature coefficient of the electric resistivity and reduction of the temperature coefficient of the inductance, so it is desirable to contain not less than 4% of Si+Al, and it is desirable to contain not more than 18% of Si+Al because the strength lowered and the machinability is degraded when contained too much. And, Co, Cu, Ni, Cr, Mo, W, V, Nb, Ta, Ti and Zr are effective elements for improving the magnetic characteristics and the strength, and so it is also preferable to contain at least one of these elements in the range of not more than 10% in total.

And the measuring shaft 2, in all or at least in the part in which the magnetostriction is detected, may be made from another material comprising, by weight percentage of, not more than 0.1% of C, not more than 3.0% of Mn, not more than 10% of Si+Al, in the range of 5 to 35% of Cr, not more than 10% of Co+Cu+Ni+Mo+W+V+Nb+Ta+Ti+Zr, with the remainder being substantially Fe, and having electromagnetic characteristics that electric resistivity $\rho_{RT}$ at room temperature is not less than 30 $\mu\Omega$−cm, temperature coefficient $\alpha\rho$ of electric resistivity $\rho$ at temperature of −50° to 150° C. is not more than $0.25 \times 10^{-2}/°C.$, and temperature coefficient $\alpha_L$ of inductance L at temperature −50° to 150° C. is not more than $0.07 \times 10^{-2}/°C.$ In this case, it is desirable to contain not more than 0.1% of C because the magnetic characteristics are degraded when C is contained too much. Because Mn is effective to improve the workability in cold and hot, but the machinability is degraded when contained too much, it is preferable to contain not more than 3.0% of Mn. Si and Al are effective elements for improvement of the electric resistivity reduction of the temperature coefficient of the electric resistivity and the temperature coefficient of the inductance, but the strength is lowered and the machinability is degraded when they are contained too much so that it is preferable to contain not more than 10% of Si+Al. Because Cr improves the corrosion resistance, it is preferable to contain not less than 5% and preferable to contain not more than 35% of Cr because Cr induces lowering of the strength. And because Co, Cu, Ni, Mo, W, V, Nb, Ta, Ti and Zr are effective elements for improving the magnetic characteristics and the strength, it is also preferable to contain at least one of these elements in the range of not more than 10% in total.

In addition to above, it is possible to use Fe—Co based or Co-based high-permeability materials having electromagnetic characteristics that electric resistivity $\rho_{RT}$ at room temperature is not less than 30 $\mu\Omega$—cm, temperature coefficient $\alpha\rho$ of electric resistivity $\rho$ at temperature of $-50°$ to $150°$ C. is not more than $0.25\times10^{-2}/°C.$, and temperature coefficient $\alpha_L$ of inductance L at temperature of $-50°$ to $150°$ C. is not more than $0.07\times10^{-2}/°C.$ In the torque detecting device according to this invention, the measuring shaft, at least in the part in which the magnetostriction is detected, has electromagnetic characteristics that electric resistivity $\rho_{RT}$ at room temperature is not less than 30 $\mu\Omega$—cm, temperature coefficient $\alpha\rho$ of electric resistivity $\rho$ at temperature of $-50°$ to $150°$ C. is not more than $0.25\times10^{-2}/°C.$, and temperature coefficient $\alpha_L$ of inductance L at temperature of $-50°$ to $150°$ C. is not more than $0.07\times10^{-2}/°C.$ Therefore, it is a remarkably improved torque detecting device in the thermal characteristics. The performance characteristics of the torque detecting device never change remarkably and the drift caused by fluctuation of the zero point is never produced even when the temperature gradient is produced in the measuring shaft. Accordingly, the accuracy of the measurement of the torque detecting device is never deteriorated.

EXAMPLE 1

A plurality of steel pieces each have a chemical composition as shown in Table 1 were used as the raw material of the measuring shaft 2 of the torque detecting device 1 shown in FIG. 1.

TABLE 1

| No. | Chemical composition (weight %) | | | | | |
|---|---|---|---|---|---|---|
| | C | Si | Mn | Cr | Mo | Fe |
| 1 | 0.20 | 0.11 | 0.12 | 0.18 | 0.19 | Bal. |
| 2 | 0.21 | 0.26 | 0.74 | 2.02 | 0.20 | Bal. |
| 3 | 0.20 | 1.02 | 0.78 | 2.02 | 0.20 | Bal. |
| 4 | 0.22 | 1.01 | 1.49 | 3.00 | 0.21 | Bal. |
| 5 | 0.19 | 2.02 | 0.76 | 3.03 | 0.20 | Bal. |

Test pieces having a height of 3 mm, a width of 3 mm and a length of 100 mm were prepared in order to measure respective electric resistivity of the steels having such chemical compositions, and different test pieces having an outer diameter of 30 mm, an inner diameter of 25 mm and a thickness of 2 mm were also prepared in order to measure respective inductance of the steels. Each of the test pieces was subjected to a carburizing at 910° C. for 2 hours and quenched into oil, then tempered at 170° C. for 2 hours.

The measurement of the electric resistivity was carried out by the four terminal method, electric resistivity $\rho_{RT}$ at room temperature was measured, and temperature coefficient $\alpha\rho$ of the electric resistivity per 1° C. was obtained by measuring the electric resistivity at temperature of $-50°$ to $150°$ C.

And the measurement of the inductance was carried out using a inductance meter, temperature coefficient $\alpha_L$ of the inductance per 1° C. was obtained by measuring the inductance at temperature of $-50°$ to $150°$ C. in frequency of 30 KHz.

Figure 4:
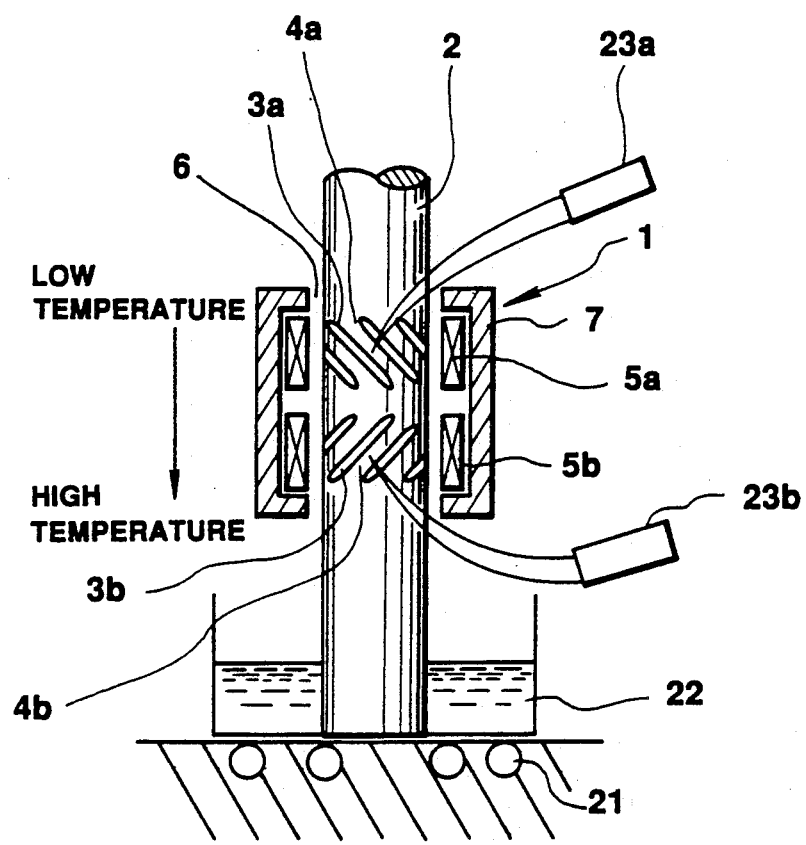
FIG. 4 is a diagram illustrating the experimental procedures for producing the temperature gradient in the measuring shaft of the torque detecting device.

On the other hand, by using the torque detecting device 1 as shown in FIG. 4, which has the measuring shaft 2 (having concave parts 3a, 3b and convex parts 4a, 4b of 2 mm in width, and 1 mm of difference in level) of 20 mm in diameter made from the steels having chemical compositions shown in Table 1, and dipping one end of said measuring shaft 2 in oil 22 heated by a heater 21, a temperature gradient was produced in the measuring shaft 2. The temperature was taken at the respective convex part 4a, 4b using thermoelectric couples 23a and 23b, furthermore, the drift per 1° C. of temperature difference between the respective convex parts 4a ans 4b was obtained by connecting coils 5a and 5b to the bridge circuit shown in FIG. 2.

Figure 5:
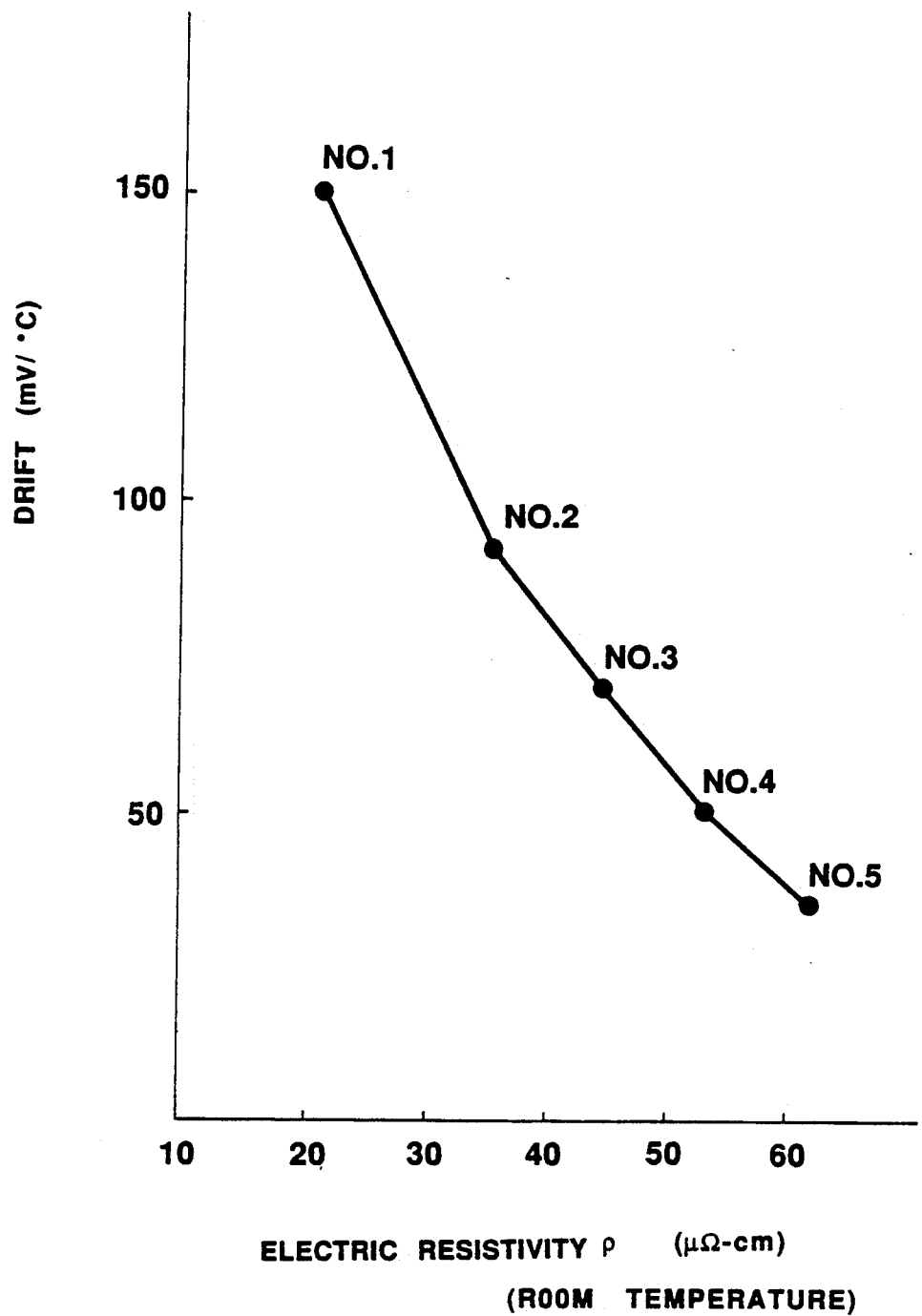
FIG. 5 is a graph exemplifying the results of the investigation on the relation between the electric resistivity and the drift.

FIG. 5 is a graph exemplifying the relationship between the drift and electric resistivity $\rho_{RT}$ at room temperature. It has been found that the drift decreases in proportion to the increase of electric resistivity $\rho_{RT}$ at room temperature.

Figure 6:
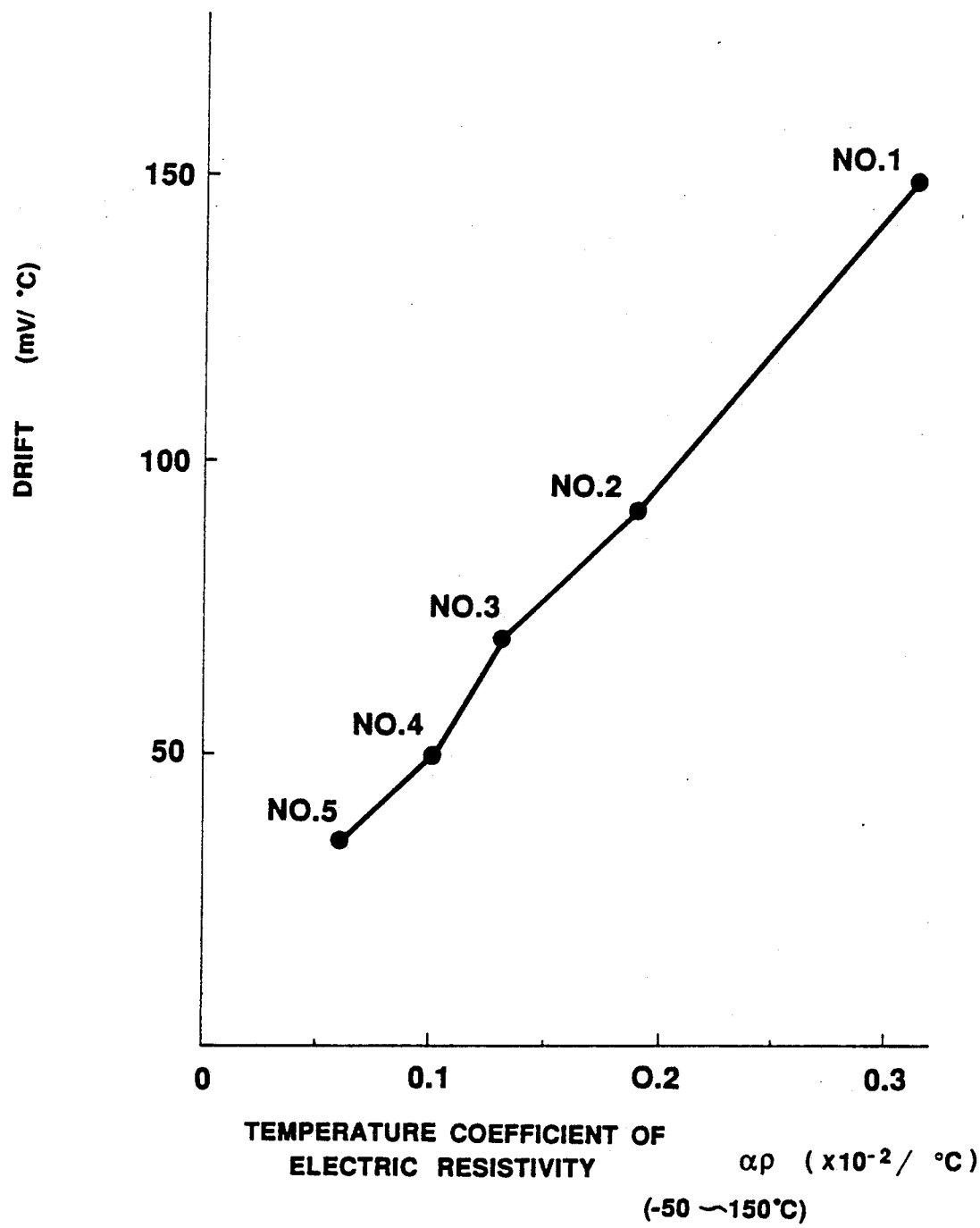
FIG. 6 is a graph exemplifying the results of the investigation on the relation between the temperature coefficient of the electric resistivity and the drift.

FIG. 6 is a graph exemplifying the relationship between the drift and temperature coefficient $\alpha\rho$ of the electric resistivity. It has been found that the drift decreases in proportion to decrease of temperature coefficient $\alpha\rho$ of the electric resistivity.

Figure 7:
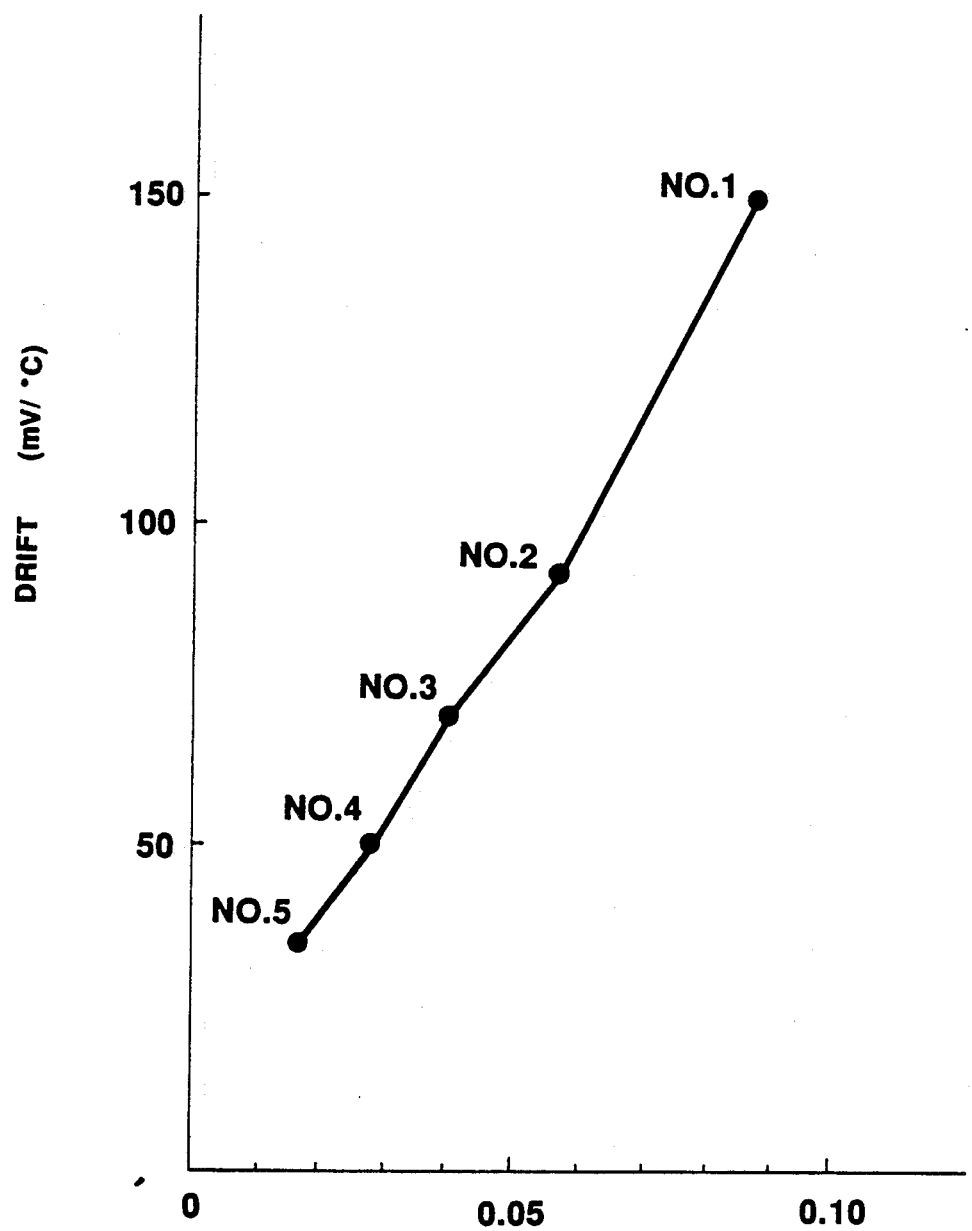
FIG. 7 is a graph exemplifying the results of the investigation on the relation between the temperature coefficient of the inductance and the drift.

Furthermore, FIG. 7 is a graph exemplifying the relationship between the drift and temperature coefficient $\alpha_L$ of the inductance, it has been found that the drift decreases in proportion to decrease of temperature coefficient $\alpha_L$ of the inductance.

EXAMPLE 2

A plurality of steel pieces each having a chemical composition as shown in Table 2-1 were used as a raw material of the measuring shaft 2 of the torque detecting device 1 shown in FIG. 1.

Said measuring shaft 2 of 20 mm in diameter having concave parts 3a, 3b and convex parts 4a, 4b of 2 mm in width and 1 mm of difference in level, was subjected to heat treatment shown also in Table 2—2 respectively. The measuring values also shown in Table 2—2 were obtained as a result of measuring electric resistivity $\rho_{RT}$ at room temperature, temperature coefficient $\alpha\rho$ of the electric resistivity and temperature coefficient $\alpha_L$ of the inductance of the respective measuring shaft 2 in the same procedures as that of the case of EXAMPLE 1.

Figure 2:
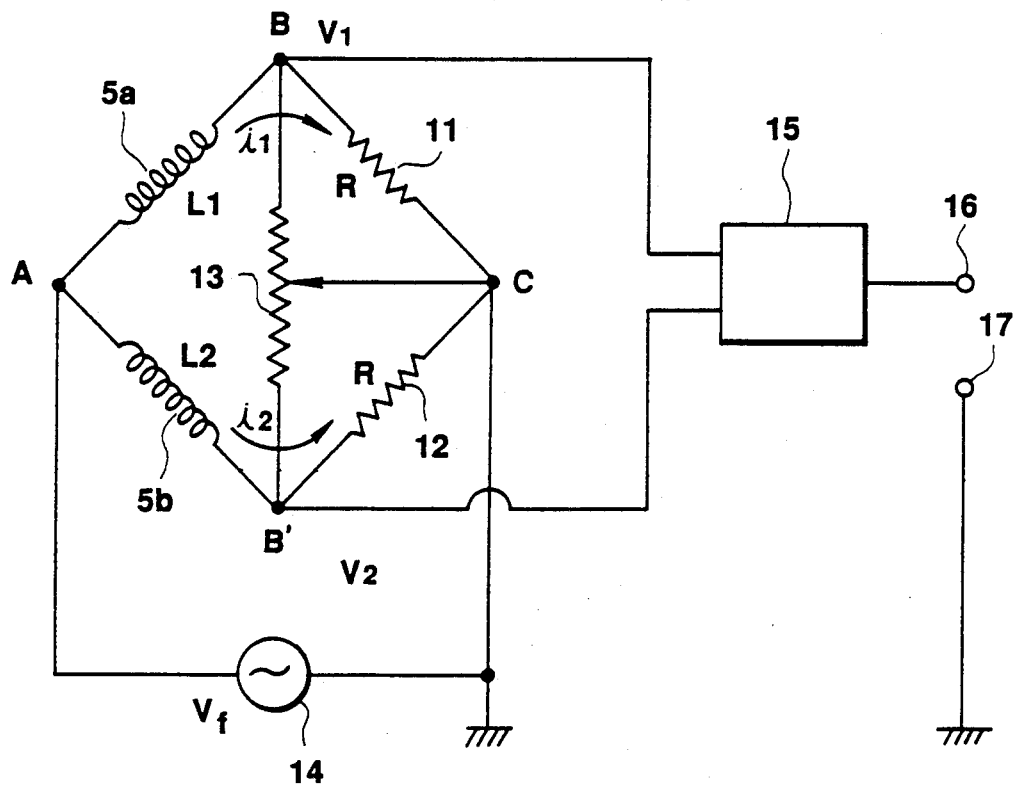
FIG. 2 is a diagram illustrating the electric circuit of the prior art torque detecting device used for detecting the torque.
Figure 3:
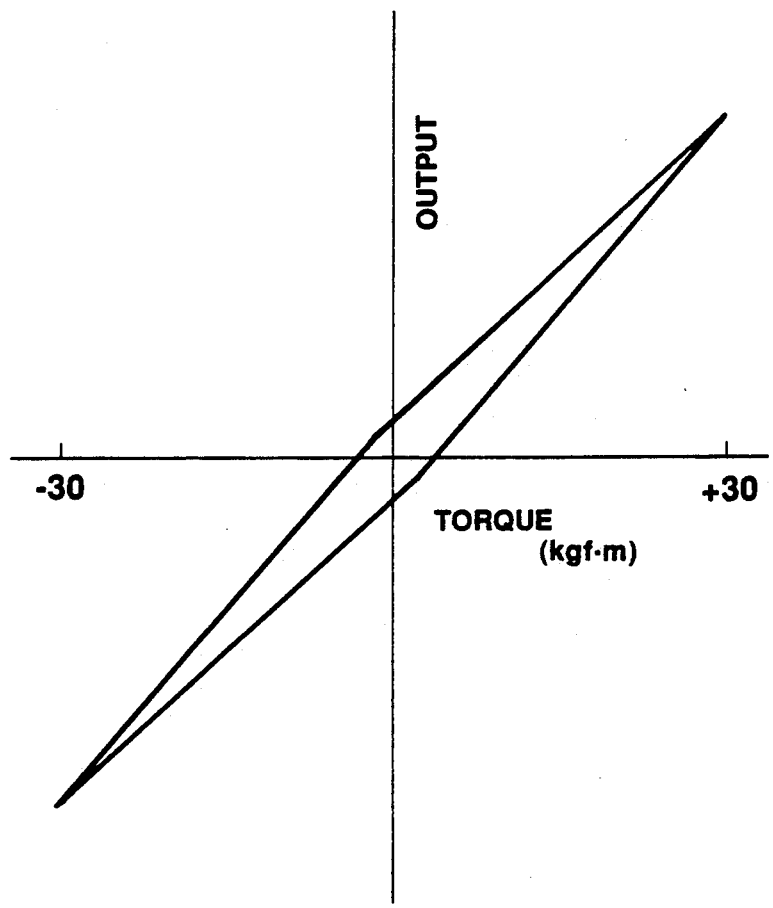
FIG. 3 is a graph showing the output characteristics of the prior art torque detecting device.

Connecting the coils 5a and 5b so as to make the electric circuit shown in FIG. 2, the respective drift was investigated. The results of the investigation were shown together in Table 2—2.

TABLE 2-1

| | No. | C | Si | Mn | Cu | Ni | Cr | Mo | others | | Fe |
|---|---|---|---|---|---|---|---|---|---|---|---|
| Example | 11 | 0.15 | 0.40 | 0.80 | — | 0.08 | 2.50 | — | — | | Bal. |
| | 12 | 0.20 | 0.25 | 0.75 | 0.07 | 0.09 | 2.00 | 0.16 | Ti 0.03 | Zr 0.05 | Bal. |
| | 13 | 0.20 | 0.30 | 0.81 | 0.03 | 0.99 | 3.03 | — | Co 2.05 | N 0.01 | Bal. |
| | 14 | 0.30 | 0.80 | 0.81 | — | 0.26 | 2.00 | 0.17 | Al 1.01 | | Bal. |
| | 15 | 0.41 | 0.35 | 0.80 | 0.08 | 2.48 | 0.50 | — | Nb 0.15 | Ti 0.05 | Bal. |
| | 16 | 0.40 | 1.53 | 0.25 | — | 3.02 | 0.35 | 0.15 | S 0.10 | Te 0.030 | Bal. |
| | 17 | 0.31 | 0.26 | 0.69 | — | 0.51 | 1.52 | 0.18 | Pb 0.16 | Te 0.035 | Bal. |
| | 18 | 0.42 | 1.02 | 0.81 | 0.13 | 2.51 | 0.48 | — | Al 0.02 | N 0.01 | Bal. |
| Example | 19 | 0.004 | 0.10 | 0.45 | — | 48.00 | — | — | — | | Bal. |
| | 20 | 0.004 | 0.08 | 0.52 | — | 68.10 | — | — | Ti 2.03 | | Bal. |
| | 21 | 0.007 | 0.08 | 0.81 | — | — | — | — | Al 13.3 | | Bal. |
| | 22 | 0.010 | 2.03 | 0.10 | — | — | 9.02 | — | — | | Bal. |
| | 23 | 0.005 | 0.07 | 0.22 | — | 0.55 | — | — | Co 49.0 | V 1.95 | Bal. |
| Comparative | 24 | 0.004 | 0.03 | 0.01 | — | — | — | — | — | | Bal. |
| Example | 25 | 0.009 | 0.04 | 0.15 | — | Bal. | — | — | — | | — |
| | 26 | 0.007 | 0.06 | 0.25 | — | 0.07 | — | — | Co 50.3 | | Bal. |

TABLE 2-2

| | No. | Heat treatment | Electric resistivity at room temperature $\rho$ RT ($\mu\Omega$-cm) | Temperature coefficient of electric resistivity $\alpha_\rho$ ($\times 10^{-2}/°C$) | Temperature coefficient of inductance $\alpha_L$ ($10^{-2}/°C$) | Drift (M$\bar{v}$/°C) |
|---|---|---|---|---|---|---|
| Example | 11 | 910° C. × 3 hr carburizing → oil cooling 170° C. × 2 hr tempering | 38 | 0.17 | 0.050 | 80 |
| | 12 | 910° C. × 3 hr carburizing → oil cooling 170° C. × 2 hr tempering | 36 | 0.17 | 0.057 | 93 |
| | 13 | 910° C. × 3 hr carburizing → oil cooling 170° C. × 2 hr tempering | 48 | 0.13 | 0.035 | 60 |
| | 14 | 550° C. × 50 hr nitriding in gas | 53 | 0.09 | 0.029 | 51 |
| | 15 | 900° C. → oil cooling 600° C. × 2 hr tempering | 37 | 0.16 | 0.055 | 85 |
| | 16 | 850° C. → oil cooling 500° C. × 2 hr tempering | 49 | 0.14 | 0.037 | 62 |
| | 17 | Induction hardening 170° C. × 2 hr tempering | 31 | 0.22 | 0.063 | 109 |
| | 18 | Induction hardening 170° C. × 2 hr tempering | 44 | 0.12 | 0.042 | 72 |
| Example | 19 | 1100° C. × 2 hr → furnace cooling | 48 | 0.13 | 0.040 | 70 |
| | 20 | 1100° C. × 2 hr → furnace cooling | 39 | 0.19 | 0.055 | 94 |
| | 21 | 1100° C. × 2 hr → oil cooling | 119 | 0.03 | 0.011 | 10 |
| | 22 | 1100° C. × 2 hr → furnace cooling | 79 | 0.07 | 0.020 | 22 |
| | 23 | 850° C. × 2 hr furnace cooling | 44 | 0.14 | 0.045 | 74 |
| Comparative | 24 | 850° C. × 2 hr furnace cooling | 12 | 0.29 | 0.101 | 180 |
| Example | 25 | 1100° C. × 2 hr → furnace cooling | 8 | 0.33 | 0.114 | 202 |
| | 26 | 850° C. × 2 hr → furnace cooling | 7 | 0.35 | 0.121 | 230 |

As shown in Table 2—2, in cases of Example Nos. 11 to 23 with the measuring shafts 2 having electromagnetic characteristics that electric resistivity $\rho_{RT}$ at room temperature is not less than 30 $\mu\Omega$−m, temperature coefficient $\alpha\rho$ of electric resistivity $\rho$ at temperature of −50° to 150° C. is not more than $0.25 \times 10^{-2}/°C$., and temperature coefficient $\alpha_L$ of inductance L at temperature of −50° to 150° C. is not more than $0.07 \times 10^{-2}/°C$., it has been confirmed that the drift of every torque detecting device 1 is small.

On the contrary, it has been confirmed that the drift is large in cases of comparative Example Nos. 24 to 26 which do not satisfy condition of electromagnetic characteristics.

As described above, the torque detecting device according to this invention has a measuring shaft, excitation means for forming a magnetic circuit wherein said measuring shaft is a part of said magnetic circuit, and detection means for detecting a magnetostriction passing through said measuring shaft, wherein said measuring shaft has following electromagnetic characteristics at least in a part in which said magnetostriction is detected: electric resistivity $\rho_{RT}$ of not less than 30 $\mu\Omega$−cm at room temperature, temperature coefficient $\alpha\rho$ of electric resistivity of not more than $0.25 \times 10^{-2}/°C$. at temperature of −50° to 150° C., and temperature coefficient $\alpha_L$ of inductance L of not more than $0.07 \times 10^{-2}/°C$. at temperature of −50° to 150° C. Therefore, the serious drift in the detection output does not occur even when the temperature gradient is produced in the axial direction of the measuring shaft. Very excellent effects are obtained since it is possible to measure the torque with accuracy more than ever.

What is claimed is:

1. A torque detecting device having a measuring shaft, excitation means for forming a magnetic circuit wherein said measuring shaft is a part of said magnetic circuit, and detection means for detecting a magnetostriction passing through said measuring shaft, wherein said measuring shaft has following electromagnetic characteristics at least in a part in which said magnetostriction is detected:

Electric resistivity $\rho_{RT}$ of not less than 30 $\mu\Omega$—cm at room temperature;

temperature coefficient $\alpha\rho$ of electric resistivity $\rho$ of not more than $0.25 \times 10^{-2}/°C.$ at temperature of $-50°$ to $150°$ C.; and temperature coefficient $\alpha_L$ of inductance L of not more than $0.07 \times 10^{-2}/°C.$ at temperature of $-50°$ to $150°$ C.

2. A torque detecting device as set forth in claim 1, wherein a concave part and a convex part making a predetermined angle with the axial direction of said measuring shaft are formed with predetermined spacing on said measuring shaft.

3. A torque detecting device as set forth in claim 1, wherein said excitation means is an excitation coil forming a magnetic circuit wherein said measuring shaft is a part of said magnetic circuit and said detection means is a detection coil for detecting a magnetostriction passing through said measuring shaft.

4. A torque detecting device as set forth in claim 3, wherein said excitation coil and said detection coil are formed from a common coil with a common yoke.

5. A torque detecting device as set forth in claim 1, wherein said measuring shaft is made, at least in a part in which the magnetostriction is detected, from a material comprising, by weight percentage of, not more than 1.5% of C., not more than 4.0% of Si, not more than 3.0% of Mn, and one or both of not more than 5.0% of Ni and not more than 5.0% of Cr, with the remainder being Fe and impurities.

6. A torque detecting device as set forth in claim 5, wherein said measuring shaft is carburized and the amount of C in the carburized layer is more than 0.1% but not more than 1.5%.

7. A torque detecting device as set forth in claim 1, wherein said measuring shaft is made, at least in a part in which the magnetostriction is detected, from a material comprising, by weight percentage of, not more than 0.1% of C, not more than 3.0% of Mn, not more than 10% of Si and Al in total, in the range of 30 to 90% of Ni, and not more than 10% of Cu, Cr, Mo, Ti, W, V, Nb, Ta and Zr in total, with the remainder being substantially Fe.

8. A torque detecting device as set forth in claim 1, wherein said measuring shaft is made, at least in a part in which the magnetostriction is detected, from a material comprising, by weight percentage of, not more than 0.1% of C, not more than 3.0% of Mn, in the range of 4 to 18% of Si and Al in total and not more than 10% of Co, Cu, Ni, Cr, Mo, W, V, Nb, Ta, Ti and Zr in total, with the remainder being substantially Fe.

9. A torque detecting device as set forth in claim 1, wherein said measuring shaft is made, at least in a part in which the magnetostriction is detected, from a material comprising, by weight percentage of, not more than 0.1% of C, not more than 3.0% of Mn, not more than 10% of Si and Al in total, in the range of 5 to 35% of Cr and not more than 10% of Co, Cu, Ni, Mo, W, V, Nb, Ta, Ti and Zr, with the remainder being substantially Fe.

10. A torque detecting device as set forth in claim 1, wherein said measuring shaft is made from a Fe—Co based high permeability material at least in a part in which the magnetostriction is detected.

11. A torque detecting device as set forth in claim 1, wherein said measuring shaft is made from a Co based high permeability material at least in a part in which the magnetostriction is detected.

12. A torque detecting device as set forth in claim 1, wherein said measuring shaft is made, at least in a part in which the magnetostriction is detected, from a material comprising, by weight percentage of, not more than 1.5% of C, not more than 4.0% of Si, not more than 3.0% of Nn, one or both of not more than 5.0% of Ni and not more than 5.0% of Cr, and at least one selected from not more than 1.0% of Cu, not more than 1.0% of Mo, not more than 0.05% of B, not more than 0.5% of W, not more than 0.5% of V, not more than 0.5% of Ti, not more than 0.5% of Nb, not more than 0.5% of Ta, not more than 0.5% of Zr, not more than 0.5% of Hf and not more than 0.1% of N, with the remainder being Fe and impurities.

13. A torque detecting device as set forth in claim 1, wherein said measuring shaft is made, at least in a part in which the magnetostriction is detected, from a material comprising, by weight percentage of, not more than 1.5% of C, not more than 4.0% of Si, not more than 3.0% of Mn, one or both of not more than 5.0% of Ni and not more than 5.0% of Cr, one or both of not more than 3.0% of Al and not more than 5.0% of Co, and at least one selected from not more than 1.0% of Cu, and not more than 1.0% of Mo, not more than 0.05% of B, not more than 0.5% of W, not more than 0.5% of V, not more than 0.5% of Ti, not more than 0.5% of Nb, not more than 0.5% of Ta, not more than 0.5% of Zr, not more than 0.5% of Hf and not more than 0.1% of N, with the remainder being Fe and impurities.

14. A torque detecting device as set forth in claim 1, wherein said measuring shaft is made, at least in a part in which the magnetostriction is detected, from a material comprising, by weight percentage of, not more than 1.5% of C, not more than 4.0% of Si, not more than 3.0% of Mn, and one or both of not more than 5.0% of Ni and not more than 5.0% of Cr, at least one selected from not more than 1.0% of Cu, not more than 1.0% of Mo, not more than 0.05% of B, not more than 0.5% of W, not more than 0.5% of V, not more than 0.5% of Ti, not more than 0.5% of Nb, not more than 0.5% of Ta, not more than 0.5% of Zr, not more than 0.5% of Hf and not more than 0.1% of N, and at least one selected from not more than 0.5% of Pb, not more than 0.5% of Bi, not more than 0.5% of S, not more than 0.3% of P, not more than 0.5% of Te, not more than 0.5% of Se, and not more than 0.05% of Ca, with the remainder being Fe and impurities.

* * * * *